United States Patent
Won (10) Patent No.: US 7,068,528 B2
(45) Date of Patent: Jun. 27, 2006

(54) LAYOUT STRUCTURE OF BIT LINE SENSE AMPLIFIER OF SEMICONDUCTOR MEMORY DEVICE

(75) Inventor: Jong-Hak Won, Gyeonggi-do (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 57 days.

(21) Appl. No.: 10/977,529

(22) Filed: Oct. 28, 2004

(65) Prior Publication Data

US 2005/0117377 A1 Jun. 2, 2005

(30) Foreign Application Priority Data

Nov. 27, 2003 (KR) ............... 10-2003-0085119

(51) Int. Cl.
*G11C 7/00* (2006.01)
(52) U.S. Cl. .................... 365/63; 365/207
(58) Field of Classification Search ............ 365/63, 365/205, 207, 208; 257/367, 368, 369
See application file for complete search history.

(56) References Cited

U.S. PATENT DOCUMENTS 5,808,930 A * 9/1998 Wada et al. ............ 365/63
6,370,054 B1 * 4/2002 Fujisawa et al. .......... 365/63
2003/0089926 A1 * 5/2003 Noda et al. ............ 257/203

* cited by examiner

*Primary Examiner*—Vu A. Le
(74) *Attorney, Agent, or Firm*—Marger Johnson & McCollom (57) ABSTRACT

A layout structure of a bit line sense amplifier is provided. According to an embodiment of the present invention, the layout structure of the bit line amplifier of a semiconductor memory device includes memory blocks structured by a plurality of cells, bit line pairs connected to the cells and a plurality of bit line sense amplifier blocks for sensing data of the cells, wherein each of the bit line sense amplifier blocks comprises: PMOS sense amplifier structured by first and second PMOS transistors; NMOS sense amplifier structured by first and second NMOS transistors; an IO line pair structured by an IO line and an IO bar line, which are placed between the PMOS sense amplifier and the NMOS sense amplifier; and a first IO switch and a second IO switch, which are connected to one of the bit line pair and the IO line pair, wherein a gate region of the first PMOS transistor, a gate region of the first NMOS transistor and the first IO switch are respectively arranged at a gate region of the second PMOS transistor, a gate region of the second NMOS transistor and the second IO switch in one direction only at predetermined spaces ΔP, ΔN and ΔI.

17 Claims, 6 Drawing Sheets

LAYOUT STRUCTURE OF BIT LINE SENSE AMPLIFIER OF SEMICONDUCTOR MEMORY DEVICE

This application claims priority from Korean Patent Application No. 2003-85119, filed on Nov. 27, 2003, the contents of which is herein incorporated by reference in its entirety.

FIELD OF THE INVENTION

This disclosure generally relates to semiconductor memory devices and, more specifically, to a layout structure of a bit line sense amplifier of a semiconductor memory device.

BACKGROUND OF THE INVENTION

A bit line sense amplifier is structured by a PMOS sense amplifier and a NMOS sense amplifier. The bit line sense amplifier amplifies data loaded in a bit line and a bit bar line of a semiconductor memory device, and thereby outputting thereof through an IO line.

In IO lines between the PMOS sense amplifier and the NMOS sense amplifier, and a layout structure of a bit line sense amplifier where an IO switch is arranged to connect the bit line and a bit bar line, a distance difference from a drain of the IO switch to each gate of a NMOS sense amplifier sharing the drain of the IO switch, a bit line and the bit bar line changes a loading of the bit line and the bit bar line. Also, a distance difference to each gate of a PMOS sense amplifier changes the loading of the bit line and the bit bar line. If the loading of the bit line is different from that of the bit bar line, there is a disadvantage to deteriorate characteristic of a memory core due to a develop difference between the bit line and the bit bar line when the IO switch is turned on.

SUMMARY OF THE INVENTION

A purpose of the present invention provides a layout structure of a bit line sense amplifier of a semiconductor memory device capable of preventing deteriorating characteristic of a memory core due to a loading mismatch by reducing a loading difference between a bit line and a bit bar line.

To accomplish these and other objects, a layout structure of a semiconductor memory device including memory block structured by a plurality of cells, bit line pairs connected to the cells and a plurality of bit line sense amplifier blocks for sensing data of the cells. Each of the bit line sense amplifier blocks comprises: PMOS sense amplifier structured by first and second PMOS transistors; NMOS sense amplifier structured by first and second NMOS transistors; an IO line pair structured by an IO line and an IO bar line, which are placed between the PMOS sense amplifier and the NMOS sense amplifier; and a first IO switch and a second IO switch, which are connected to one of the bit line pairs and the IO line pair. A gate region of the first PMOS transistor, a gate region of the first NMOS transistor and the first IO switch are respectively arranged at a gate region of the second PMOS transistor, a gate region of the second NMOS transistor and the second IO switch in one direction only at predetermined spaces $\Delta P$, $\Delta N$ and $\Delta I$.

In a preferred embodiment, the predetermined distances $\Delta P$ and $\Delta N$ are the same.

In a preferred embodiment, the predetermined distances $\Delta I$ and $\Delta N$ are the same.

In a preferred embodiment, the predetermined distances $\Delta P$ and $\Delta I$ are the same.

In a preferred embodiment, the gate of the first PMOS transistor, the gate of the second PMOS transistor, a drain of the first switch and a drain of the second switch are disposed to be four vertexes of parallelogram.

In a preferred embodiment, the gate of the first NMOS transistor, the gate of the second NMOS transistor, a drain of the first switch and a drain of the second switch are disposed to be four vertexes of parallelogram.

In a preferred embodiment, a difference of a distance from the gate of the first PMOS transistor to the first switch and a distance from the gate of the second PMOS transistor to the second switch is the same in the each of the bit line sense amplifier blocks.

In a preferred embodiment, a difference of a distance from the gate of the first NMOS transistor to the first switch and a distance from the gate of the second NMOS transistor to the second switch is the same in the each of the bit line sense amplifier blocks.

In a preferred embodiment, the first and second IO switches are transistors. Drains of the first and second IO switches are respectively connected to the bit line and a bit bar line. Sources of the first and second IO switches are respectively connected to the IO line and the IO bar line. Gates of the first and second IO switches are respectively connected to a column selection line CSL.

In a preferred embodiment, a difference of a distance from the gate of the drain of the first PMOS transistor to the first switch and a distance from the gate of the drain of the second PMOS transistor to the second switch is smaller than 1 μm.

In a preferred embodiment, a difference of a distance from the gate of the drain of the first NMOS transistor to the first switch and a distance from the gate of the drain of the second NMOS transistor to the second switch is smaller than 1 μm.

To accomplish these and other objects, a layout method of a bit line sense amplifier of a semiconductor memory device having N piece of a bit line and a bit bar line comprising the steps of: arranging N piece of PMOS sense amplifier regions constituted with two PMOS transistors having a predetermined separation distance L in the bit line direction between gate regions; arranging N piece of NMOS sense amplifier regions constituted with two NMOS transistors where each gate region is apart as much as the same distance in the bit line direction from each gate region of the PMOS transistors.; arranging 2N pieces of IO lines between the PMOS sense amplifier regions and the NMOS sense amplifier regions; and arranging 2N piece of IO switches for connecting gate regions of the PMOS and NMOS transistors with the IO lines through the bit lines and the bit bar lines. The IO switches are connected to IO lines where a bit line direction distance between an IO switch connected to a bit line and an IO switch connected to the bit bar line is the closest to the separation distance L.

In a preferred embodiment, the step of arranging the IO switches comprises: a first step for separating (2N/k) pieces of an IO line group having k piece of the IO lines from 2N pieces of the IO lines; a second step for selecting an IO line group among the IO line groups; a third step for selecting any one IO line where an IO switch is not connected in the selected IO line group to connect an IO switch connected to a bit line of any one of bit line pairs; a fourth step for selecting any one IO line group among the non-selected IO line groups; a fifth step for selecting any one IO line where an IO switch is not connected in the selected IO line group to connect an IO switch connected to a bit bar line of the bit line pairs; arranging the IO switch by repeating the second to fifth steps with respect to the rest of each bit line pairs among N piece of the bit lines.

In a preferred embodiment, the selected IO line in the fifth step is an IO line having a separation distance closest to the separation distance L from the selected IO line in third step.

DETAILED DESCRIPTION OF THE PREFERRED EMBODIMENT

The present invention will be described more fully hereinafter with reference to the accompanying drawings, in which exemplary embodiments of the invention are shown.

An embodiment of the present invention is described about a layout structure of a bit line sense amplifier of a semiconductor memory device having eight bit line pairs, eight IO line pairs and sixteenth IO switches with respect to each of sixteenth IO lines.

Figure 1:
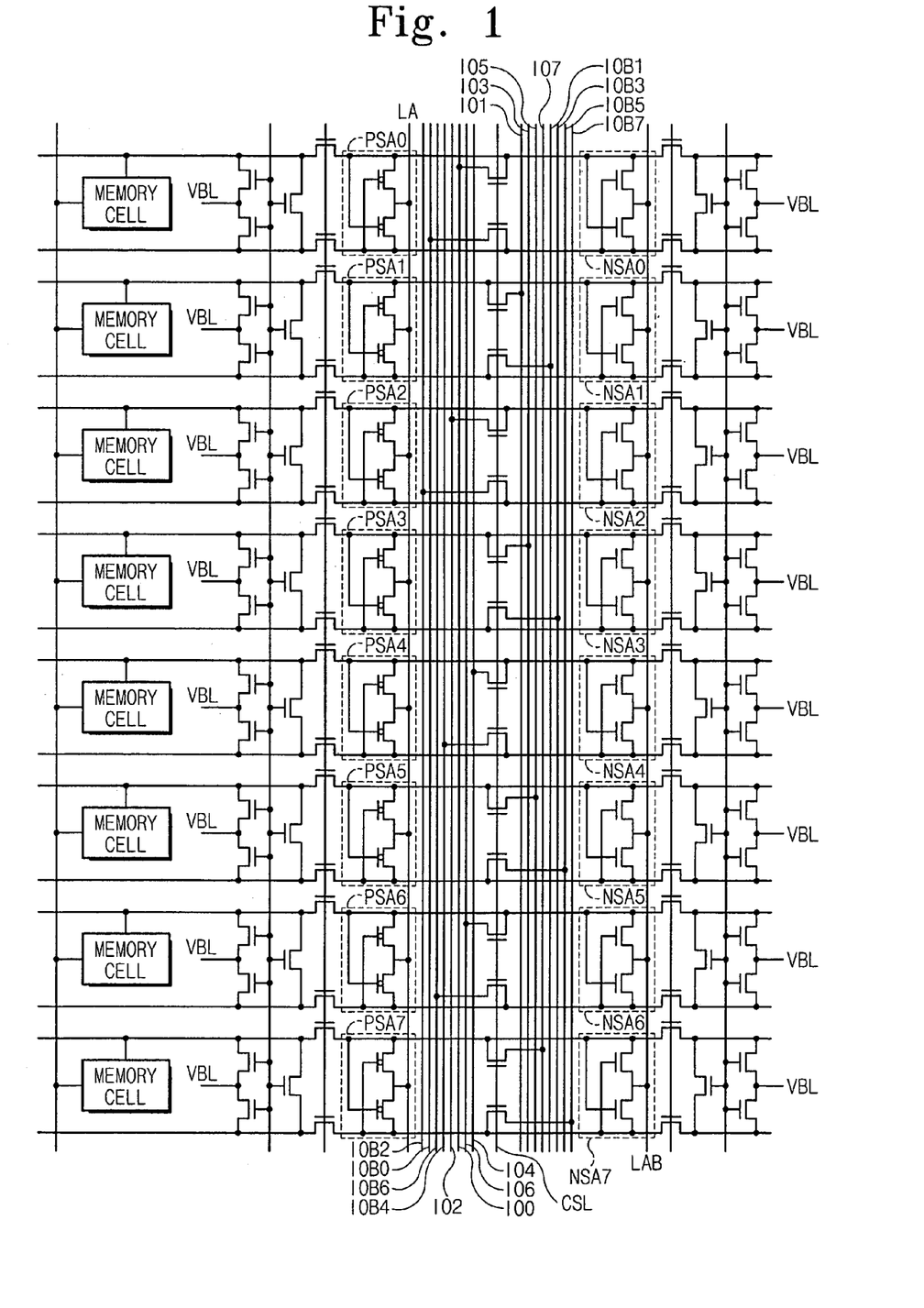
FIG. 1 is a view showing circuit construction of a bit line sense amplifier according to embodiments of the present invention.

FIG. 1 is a view showing construction of the bit line sense amplifier according to an embodiment of the present invention. FIGS. 2A to 2E are views showing the layout structure of the bit line sense amplifier and an arrangement of an IO switch according to an embodiment of the present invention.

Referring to Figs, the bit line sense amplifier according to an embodiment of the present invention comprises: eight bit line pairs; eight IO line pairs; eight NMOS sense amplifiers; eight PMOS sense amplifiers; and sixteenth IO switches.

The eight bit line pairs are structured by alternately arranging eight bit lines BL0–BL7 and eight bit bar lines BLB0–BLB7 in parallel with each other.

The eight IO line pairs are arranged in a vertical direction with respect to the bit line pairs. The IO line pairs include eight IO lines IO0–IO7 and eight IO bar lines IOB0–IOB7.

The eight PMOS sense amplifiers PSA0–PSA7 are arranged in a vertical direction with respect to the bit line pairs on the left rather than the IO line pairs on the bit line. Each of the PMOS sense amplifiers includes two PMOS transistors.

The eight NMOS sense amplifiers NSA0–NSA7 are arranged in a vertical direction with respect to the bit line pairs and they are located on the right of the IO line pairs. Each of the NMOS sense amplifiers includes two NMOS transistors.

The IO switches are embodied by a NMOS transistor. In the NMOS transistor, a drain is connected to a bit line or a bit bar line, a gate is connected to a column selection line CSL, and a source is connected to an IO line or a IO bar line of the IO line pairs.

In the layout structure of the bit line sense amplifier in accordance with an embodiment of the present invention, a method for arranging an IO switch will be described referring to Figs hereinafter.

Figure 2A:
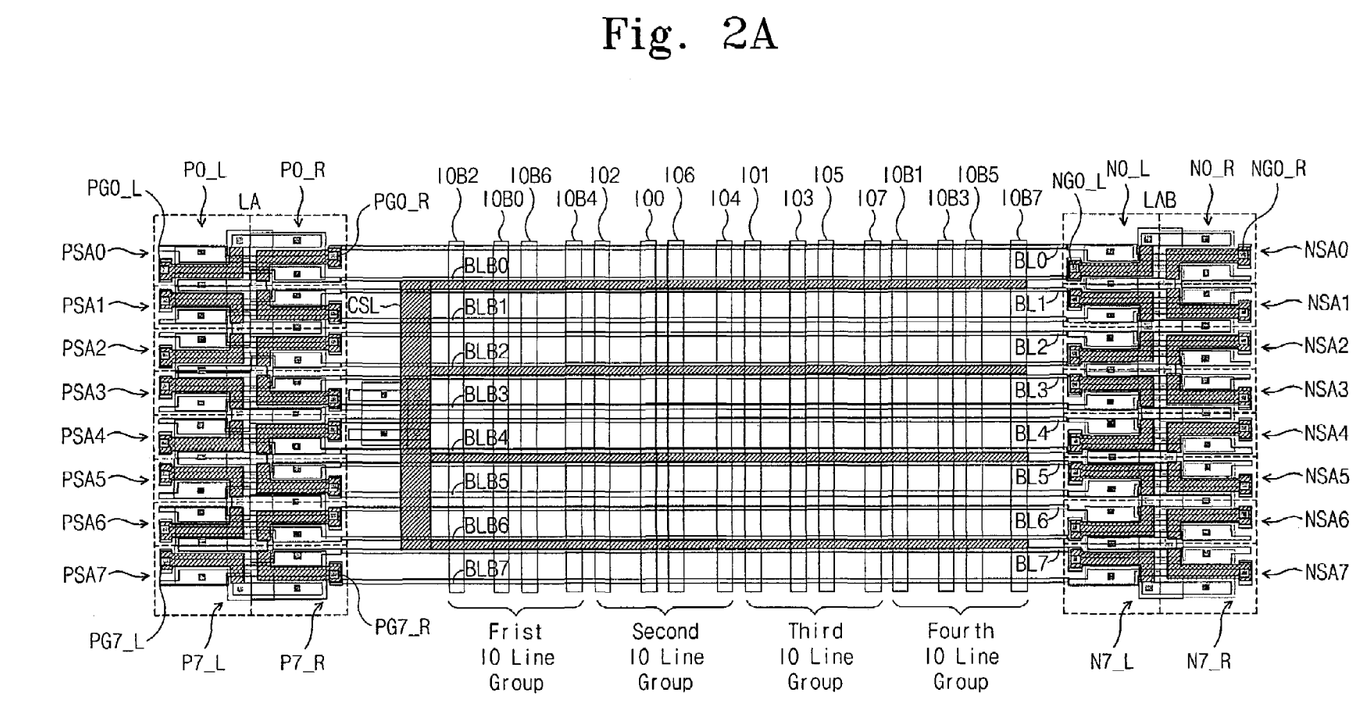
FIGS. 2A to 2E are views showing a layout structure and arrangement of the bit line sense amplifier according to an embodiment of the present invention.

FIG. 2A shows a layout before the IO switch is not arranged.

As shown in FIG. 2A, the PMOS sense amplifier PASO is structured by PMOS transistors P0_R and P0_L. In the PMOS transistor P0_R, a gate PG0_R is close by IO line pairs. In the PMOS transistor P0_L, a gate PG0_L is far away from the IO line pairs in comparison with the gate PG0_R. The rest of the PMOS sense amplifiers PSA1–PSA7 also have the same construction.

The NMOS sense amplifier NSA0 is structured by NMOS transistors N0_R and N0_L. In the NMOS transistor N0_L, a gate NG0_L is close by IO line pairs. In the NMOS transistor N0_R, a gate NG0_R is far away from the IO line pairs in comparison with the gate NG0_R. The rest of the NMOS sense amplifiers NSA1–NSA7 also have the same construction.

Two PMOS transistors P0_R and P0_L of the PMOS sense amplifier PASO are respectively the bit line BL0 and the bit bar line BLB0. Two NMOS transistors N0_R and N0_L of the NMOS sense amplifier NSA0 are respectively the bit line BL0 and the bit bar line BLB0.

Specifically, the gate PG0_R of the PMOS transistor P0_R is connected to the bit line BL0. The gate PG0_R is close by IO line pairs among the PMOS transistors P0_R and P0_L of the PMOS sense amplifier PASO. The gate NG0_R of the NMOS transistor N0_L is connected to the bit bar line BLB0. The gate NG0_R is close by IO line pairs among the NMOS transistors N0_R and N0_L of the NMOS sense amplifier NSA0. As a result, four gates PG0_R, PG0_L, NG0_R and NG0_L are arranged to be parallelogram shape.

Figure 2B:
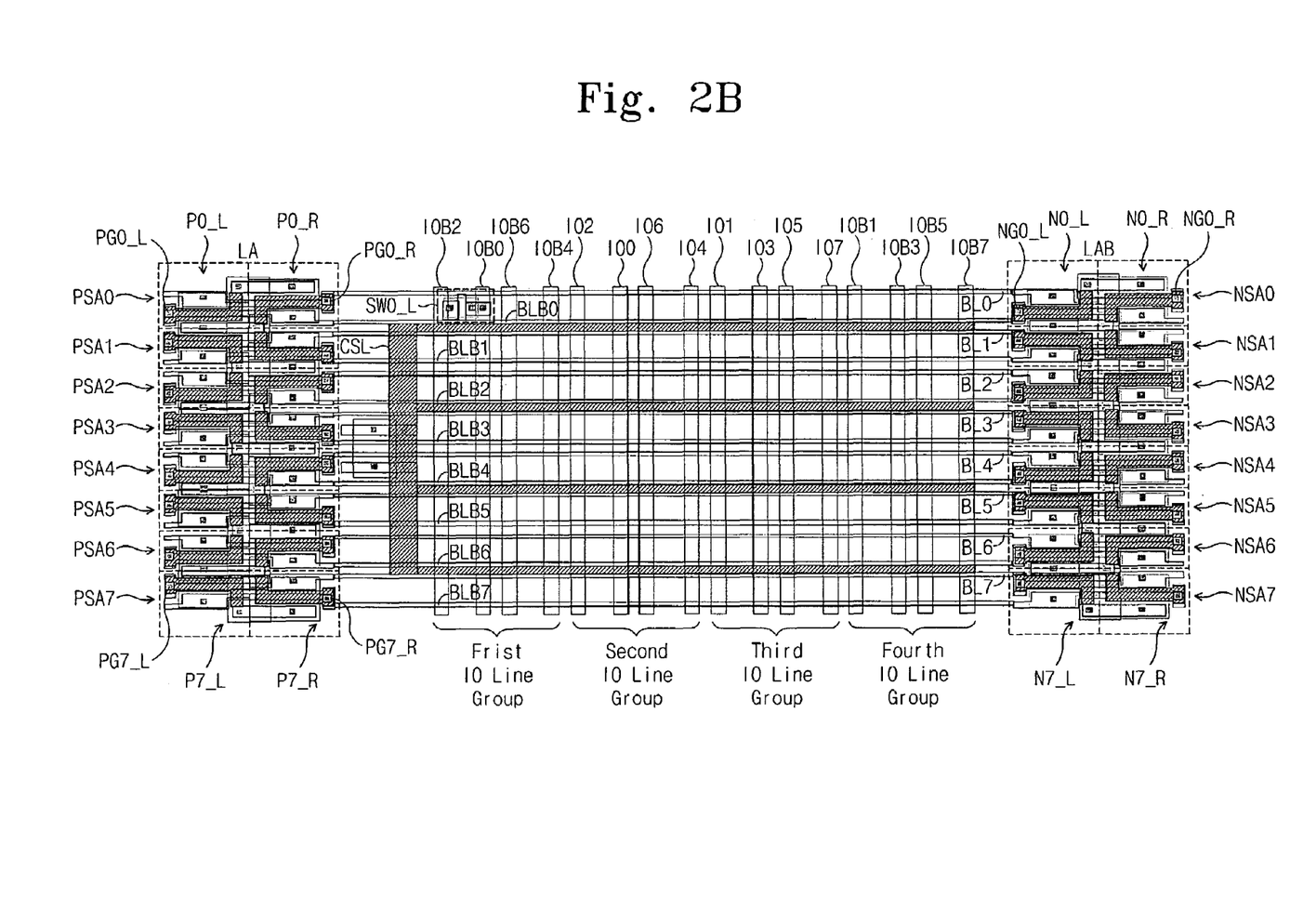
Figure 2C:
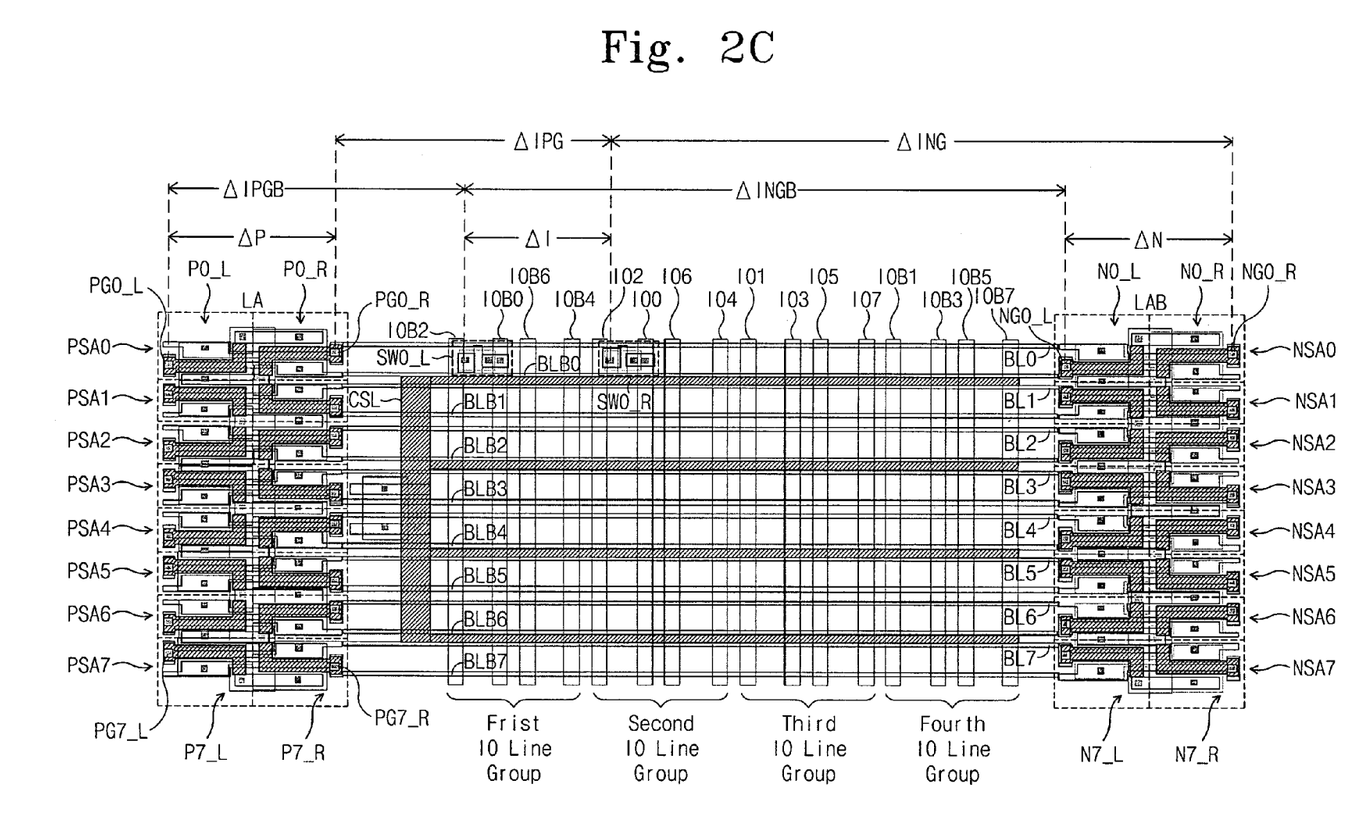
Figure 2D:
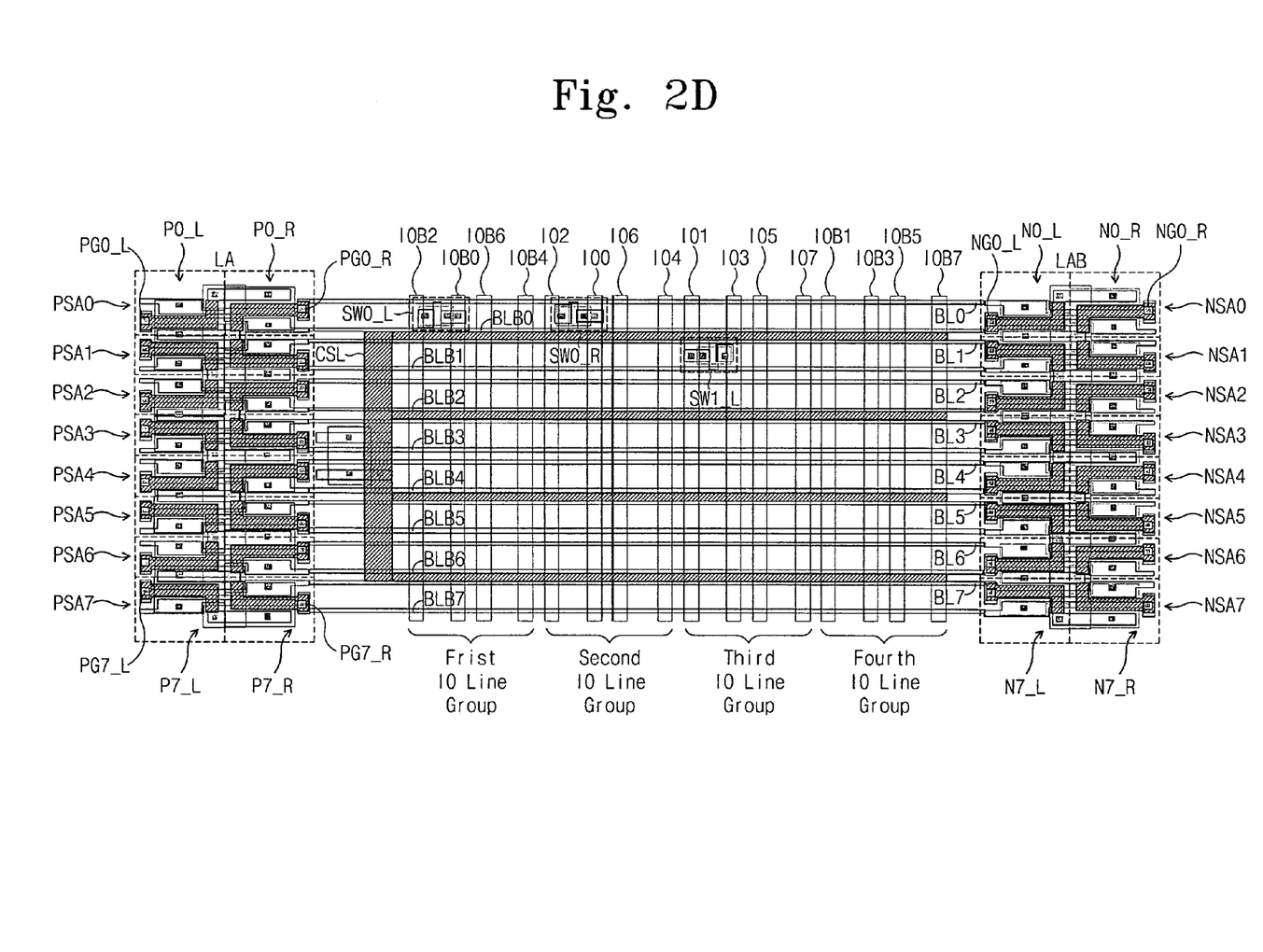
Figure 2E:
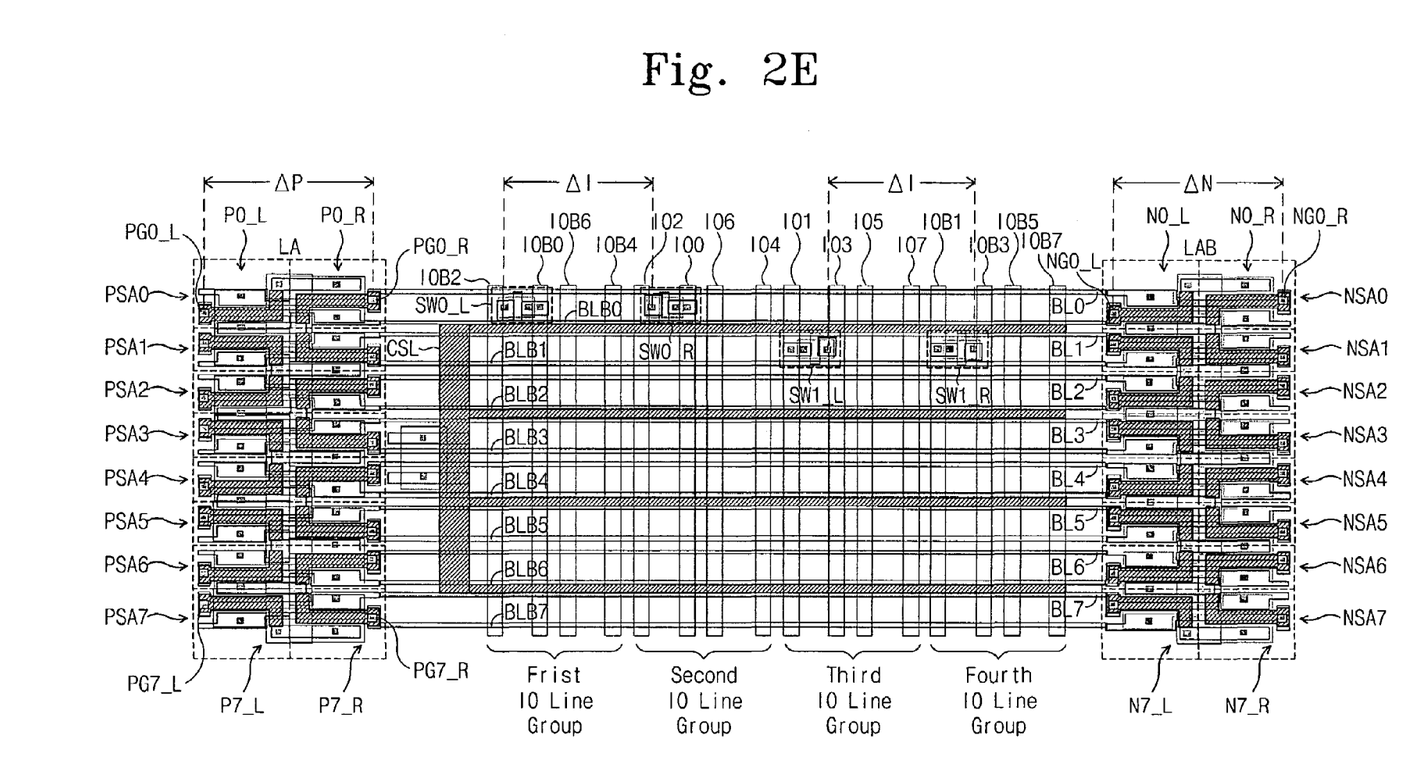

FIG. 2B shows an arrangement of the IO switch connected to the bit bar line BLB0, and FIG. 2C shows an arrangement of another IO switch added.

As shown in FIGS. 2B and 2C, an IO switch SW0_L is arranged in order that a drain is connected to the bit bar line BLB0, and an IO switch SW0_R is arranged in order that a drain is connected to the bit line BL0.

Under the above arrangement, a drain of the IO switch far away from the PMOS sense amplifier PASO is connected through the bit line BL0 to a gate of the PMOS transistor P0_R, which is located close by IO line pairs among the PMOS transistors P0_R and P0_L of the PMOS sense amplifier PASO. In addition, the drain of the IO switch far away from the PMOS sense amplifier PASO is connected to a gate of the NMOS transistor N0_R, which is located close by IO line pairs among the NMOS transistors N0_R and N0_L of the NMOS sense amplifier NSA0.

Additionally, a drain of the IO switch close by the PMOS sense amplifier PASO is connected through the bit line BLB0 to a gate of the PMOS transistor P0_L far away from the IO line pairs among the PMOS transistors P0_R and P0_L of the PMOS sense amplifier PASO. The drain of the IO switch close by the PMOS sense amplifier PASO is connected to a gate of the NMOS transistor N0_L far away from the IO line pairs among the NMOS transistors N0_R and N0_L of the NMOS sense amplifier NSA0.

Under the above arrangement of the IO switch, if gates of two PMOS transistors of the PMOS sense amplifier PASO are connected to drains of the IO switches SW0_L and SW0_R, their shape is similar to parallelogram. In addition, if gates of two NMOS transistors of the NMOS sense amplifier NSA0 are connected to drains of the IO switches SW0_L and SW0_R, their shape is similar to parallelogram.

In case that the PMOS sense amplifier PASO, NMOS sense amplifier NSA0 and IO switches are arranged according to the above arrangement, the gate PG0_R of the PMOS transistor P0_R is separated as much as $\Delta P$ distance in the direction from the PMOS sense amplifier on the bit line to the NMOS sense amplifier from the gate PG0_L of the PMOS transistor P0_L.

In FIGS. 2A to 2E, shaped portions in the PMOS sense amplifier PAS0–PSA7 are equivalent to a gate region, and portions having "■" in the shape portions are equivalent to a gate contact. In the detailed description of the present invention, the ΔP distance is defined as a distance between gate contacts as a matter of convenience.

Furthermore, the gate NGO_R of the NMOS transistor N0_R is separated as much as ΔN distance in the direction from the PMOS sense amplifier on the bit line to the NMOS sense amplifier from the gate PGO_L of the NMOS transistor N0_L.

In FIGS. 2A to 2E, shaped portions in the NMOS sense amplifier NSA0–NSA7 are equivalent to the gate region, and portions having "■" in the shape portions are equivalent to the gate contact. In the detailed description of the present invention, ΔN distance is defined as a distance between gate contacts as a matter of convenience.

In addition, the IO switch SWO_R is separated as much as ΔI distance in the direction from the PMOS sense amplifier to NMOS sense amplifier from the IO switch SWO_L. In the detailed description of the present invention, the ΔI distance is defined as a distance between drains of the IO switches as a matter of convenience.

As previously mentioned, in case that ΔP, ΔN and ΔI are defined, and each of the PMOS sense amplifier, the NMOS sense amplifier and the IO switches are arranged, ΔP should be identical to ΔN, and ΔI should be identical to ΔP and ΔN to prevent loading difference of the semiconductor memory device on the bit line. In other words, to minimize loading difference of the semiconductor memory device, it is essential to minimize difference of ΔP and ΔN as well as to make ΔI, ΔP and ΔN have the same value.

In advance, distance between each PMOS sense amplifier and a gate region of each NMOS sense amplifier is the same as a distance between gate contacts to minimize difference of ΔP and ΔN.

After ΔP becomes the same as ΔN, it is necessary to equal or have the minimum difference ΔI with ΔP or ΔN.

Now, a method for determining the IO bar line IO0 and the IO line IO0 to equal or have the minimum difference ΔI with ΔP or ΔN will be described hereinafter. A source of the IO switch SWO_R is connected to a source of the IO switch SWO_L.

As shown in Figs, eight IO line pairs are arranged in the same way as a number of the bit line pairs. And, sixteen lines are divided into a first IO line group through a fourth IO line group, which have four lines, respectively. The sixteen lines are structured by eight IO lines and eight IO bar lines.

First of all, one of IO line group among the four IO line groups is selected. Then, one of line among four lines in the selected IO line group is selected. This selected line is determined to the IO bar line to be connected through the IO switch SWO_L to the bit line. In FIG. 2B, an IO line located second from left in the first IO line group is selected as the IO bar line IOB0.

Among four IO line groups, one IO line group of IO line groups except for the selected IO line group is selected. And, one line of four lines in the selected IO line group is selected. The selected line is determined to an IO line IO0 to be connected through the IO switch SWO_R to the bit line. FIG. 2C, an IO line located second from left in the second IO line group is selected as the IO line IO0.

The IO line IO1 and the IO bar line IOB1 through IO line IO7, and the IO bar line IOB7 are determined in the same way as the method mentioned above.

In Figs, a distance between gates NGO_L and NGO_R of two NMOS transistors of the NMOS sense amplifier NSAO is ΔN. A distance between gates PGO_L and PGO_R of two PMOS transistors of the NMOS sense amplifier PSAO is ΔP. A distance between a drain of the IO switch SWO_L connected to the bit bar line BLBO and a drain of the IO switch SWO_R connected to the bit line BLO is ΔI.

At this time, a difference of a distance ΔING from a drain of the IO switch SWO_R to the gate NGO_R of the NMOS transistor and a distance ΔINGB from a drain of the IO switch SWO_L to a gate of the NMOS transistor can be represented by ΔI-ΔN. In this case, the IO switch SWO_R and the NMOS transistor are connected to the bit line BLO, respectively. The IO switch SWO_L is connected to the bit bar line BLBO. Also, a difference of a distance ΔIPG from the drain of the IO switch SWO_R to the gate NGO_R of the PMOS transistor and a distance ΔIPGB from a drain of the IO switch to a gate of the PMOS transistor can be represented by ΔI-ΔP. In this case, the IO switch SWO_R and the PMOS transistor are connected to the bit line BLO, respectively. The IO switch is connected to the bit bar line BLBO.

On assuming that ΔP and ΔN are constant, it is possible to control ΔI-ΔP or ΔI-ΔN by controlling ΔI. In addition, to solve deteriorating of a memory core characteristic caused by a develop difference of the bit line and the bit bar line, it is essential to minimize ΔI-ΔP or ΔI-ΔN.

To minimize ΔI-ΔP or ΔI-ΔN, ΔI should close to ΔP or ΔN. Accordingly, in the layout structure of the bit line amplifier comprising four IO line groups, after selecting the IO line group and the IO line, which will be connected to the bit line BLO and the IO switch SWO_R, the IO line group including the IO line should be selected. In this case, the IO line performs a function in order that ΔI is close to ΔN or ΔP when the IO line group to be connected to the bit bar line BLBO and the IO switch SWO_L is selected.

That is, the IO line group is selected as second IO line group by calculating whether ΔI is as close as possible to ΔN or ΔP or not when the IO line group adjacent to the first selected IO line group is selected as the second IO line group or when the IO line group is separated as much as a predetermined IO line group from the first selected IO line group. In this case, the IO line group includes the IO line performing a function so that ΔN is as close as reasonably possible to ΔN or ΔP.

In other words, in FIG. 2C, an IO line group including the IO line connected to the bit line BLO is selected as a first IO line group, and an IO line group including the IO bar line connected to the bit bar line BLBO is selected as a second IO line group adjacent to the first IO line group.

When the IO line is selected in the selected IO line group, the following particulars should be considered to maintain constantly a loading difference of the bit line and the bit bar line in each bit line pairs.

To maintain constantly a loading difference in each bit line pairs, ΔI-ΔP or ΔI-ΔN always has the constant value in each bit line pair. In other words, when ΔP and ΔN are constant, ΔI should have constant value in all bit line pairs. To accomplish this, the IO bar line and the IO line, which are connected to the bit bar line and the bit line in each bit line pair, are selected, the IO line group selected first is always separated from the IO line group selected second as much as a number of constant IO line group. In other words, if a first selected IO line group is adjacent to a second selected IO line group, that is, the first selected IO line group is a first IO line group, and the second selected IO line group is a second IO line group in any bit line pair, a first selected IO line group should be adjacent to a second selected IO line group in the rest of the bit line pairs. In addition, an IO line selected in a second selected IO line group corresponds to an IO line selected in a first selected IO line group. That is, if IO line located second from the left in IO line groups of the first IO line group is selected as an IO line connected to the bit line BLO, an IO line located second from the left on the rest of IO line groups should be selected as an IO bar line connected to the bit bar line BLBO.

As previously mentioned, according to an embodiment of the present invention, there is an advantage to prevent the memory core characteristic caused by loading mismatch by reducing a loading difference between the bit line and the bit bar line.

Changes can be made to the invention in light of the above detailed description. In general, in the following claims, the terms used should not be construed to limit the invention to the specific embodiments disclosed in the specification and the claims, but should be construed to include all methods and devices that are in accordance with the claims. Accordingly, the invention is not limited by the disclosure, but instead its scope is to be determined by the following claims.

What is claimed is:

1. A semiconductor memory device that has a layout structure including a memory block structured by a plurality of cells, bit line pairs connected to the cells and a plurality of bit line sense amplifier blocks for sensing data of the cells, wherein each of the bit line sense amplifier blocks comprises:
   a PMOS sense amplifier including first and second PMOS transistors;
   an NMOS sense amplifier including first and second NMOS transistors;
   an IO line pair including an IO line and an IO bar line, which are placed between the PMOS sense amplifier and the NMOS sense amplifier; and
   a first IO switch and a second IO switch, which are connected to one of the bit line pairs and the IO line pair,
   wherein a gate region of the first PMOS transistor, a gate region of the first NMOS transistor and the first IO switch are respectively arranged at a gate region of the second PMOS transistor, a gate region of the second NMOS transistor and the second IO switch in one direction only at predetermined spaces ΔP, ΔN and ΔI.

2. The semiconductor memory device of claim 1, wherein the predetermined distances ΔP and ΔN are the same.

3. The semiconductor memory device of claim 1, wherein the predetermined distances ΔI and ΔN are the same.

4. The semiconductor memory device of claim 1, wherein the predetermined distances ΔP and ΔI are the same.

5. The semiconductor memory device of claim 1, wherein the predetermined distances ΔP, ΔN and ΔI are all the same.

6. The semiconductor memory device of claim 1, wherein the gate of the first PMOS transistor, the gate of the second PMOS transistor, a drain of the first switch and a drain of the second switch are disposed to be four vertexes of parallelogram.

7. The semiconductor memory device of claim 1, wherein the gate of the first NMOS transistor, the gate of the second NMOS transistor, a drain of the first switch and a drain of the second switch are disposed to be four vertexes of parallelogram.

8. The semiconductor memory device of claim 1, wherein a difference of a distance from the gate of the first PMOS transistor to the first switch and a distance from the gate of the second PMOS transistor to the second switch is the same in the each of the bit line sense amplifier blocks.

9. The semiconductor memory device of claim 1, wherein a difference of a distance from the gate of the first NMOS transistor to the first switch and a distance from the gate of the second NMOS transistor to the second switch is the same in the each of the bit line sense amplifier blocks.

10. The semiconductor memory device of claim 1, wherein the first and second IO switches are transistors, and
   wherein drains of the first and second IO switches are respectively connected to the bit line and a bit bar line, and
   wherein sources of the first and second IO switches are respectively connected to the IO line and the IO bar line, and
   wherein gates of the first and second IO switches are respectively connected to a column selection line CSL.

11. The semiconductor memory device of claim 10, wherein a difference of a distance from the gate of the first PMOS transistor to the drain of the first switch and a distance from the gate of the second PMOS transistor to the drain of the second switch is smaller than 1 μm.

12. The semiconductor memory device of claim 10, wherein a difference of a distance from the gate of the first NMOS transistor to the drain of the first switch and a distance from the gate of the second NMOS transistor to the drain of the second switch is smaller than 1 μm.

13. A layout method of a bit line sense amplifier of a semiconductor memory device having N piece of a bit line and a bit bar line comprising:
   arranging N piece of PMOS sense amplifier regions constituted with two PMOS transistors having a predetermined separation distance L in the bit line direction between gate regions;
   arranging N piece of NMOS sense amplifier regions constituted with two NMOS transistors where each gate region is apart as much as the same distance in the bit line direction from each gate region of the PMOS transistors;
   arranging 2N pieces of IO lines between the PMOS sense amplifier regions and the NMOS sense amplifier regions; and
   arranging 2N piece of IO switches for connecting gate regions of the PMOS and NMOS transistors with the IO lines through the bit lines and the bit bar lines, wherein the IO switches are connected to IO lines where a bit line direction distance between an IO switch connected to a bit line and an IO switch connected to the bit bar line is substantially equal to the separation distance L.

14. The layout method of claim 13, wherein the step of arranging the IO switches comprises:
   separating (2N/k) pieces of an IO line group having k piece of the IO lines from 2N pieces of the IO lines;
   selecting an IO line group among the IO line groups;
   selecting any one IO line where an IO switch is not connected in the selected IO line group to connect an IO switch to a bit line of any one of bit line pairs;
   selecting any one IO line group among the non-selected IO line groups;
   selecting any one IO line where an IO switch is not connected in the selected IO line group to connect an IO switch to a bit bar line of the bit line pairs; and
   arranging the IO switch by repeating the second to fifth steps with respect to the rest of each bit line pairs among N piece of the bit lines.

15. The layout method of claim 14, wherein the selected IO line in the fifth step is an IO line having a separation distance closest to the separation distance L from the selected IO line in third step.

16. A layout structure of a sense amplifier comprising:

N piece of bit line pairs structured by alternately arranging N piece of a bit line and N piece of a bit bar line in parallel with each other;

N piece of IO line pairs arranged in a vertical direction relative to the bit line pair;

N piece of PMOS sense amplifiers arranged in a left side/right side in comparison with the N piece of the IO line pairs, N piece of PMOS sense amplifiers structured by two PMOS transistors;

N piece of NMOS sense amplifiers arranged in a left side/right side in comparison with the N piece of the IO line pairs, N piece of NMOS sense amplifiers structured by two PMOS transistors;

2N pieces of an IO switch including first, second and third terminals, wherein the first terminal is connected to one of a bit line or a bit bar line, and wherein the second terminal is connected to one of an IO line, and wherein the third terminal for switching between the first terminal and the second terminal is connected to a column selection line, wherein a difference $\Delta INGB - \Delta ING$ of a first distance $\Delta ING$ from the first terminal of the IO switch connected to the bit line of one of bit line pair to a gate of the NMOS transistor and a second distance $\Delta INGB$ from the first terminal of the IO switch to the gate of the NMOS transistor is all same, and wherein the IO switch is connected to the bit line of one of the bit line pair, and the NMOS transistor is one of two NMOS transistors of the NMOS sense amplifier in the first distance, and wherein the IO switch is connected to the bit bar line of the bit line pair, and the NMOS transistor is one of the rest of two NMOS transistors of the sense amplifier in the second distance, and wherein the third terminal for switching between the first terminal and the second terminal is connected to a column selection line, wherein a difference $\Delta INGB - \Delta ING$ of a first distance $\Delta ING$ from the first terminal of the IO switch connected to the bit line of one of bit line pair to a gate of the NMOS transistor and a second distance $\Delta INGB$ from the first terminal of the IO switch to the gate of the NMOS transistor is all same, and wherein the IO switch is connected to the bit line of one of the bit line pair, and the PMOS transistor is one of two PMOS transistors of the PMOS sense amplifier in the first distance, and wherein the IO switch is connected to the bit bar line of the bit line pair, and the PMOS transistor is one of the rest of two PMOS transistors of the sense amplifier in the second distance.

17. The layout structure of claim 16, wherein the first terminal of the IO switch is connected through the bit line and the bit bar line to a gate located close to the first terminal and a gate far away the first terminal, and wherein the IO switch is far away the NMOS sense amplifier among two IO switches connected to each bit line of one of the bit line pair and the bit bar line of the first terminal, and wherein the gate located close to the first terminal is one of gates of two NMOS transistors of the NMOS sense amplifier, and wherein the gate located far away the first terminal is one of gates of two PMOS transistors of the PMOS sense amplifier, and the first terminal of the rest of the IO switch among two IO switches is connected to a gate located far away the first terminal among gates of two NMOS transistors of the NMSO sense amplifier and a gate located close to the first terminal among gates of two PMOS transistors of the PMOS sense amplifier.

* * * * *